United States Patent
Dhamankar

(10) Patent No.: US 7,051,261 B1
(45) Date of Patent: May 23, 2006

(54) TURBO ENCODER WITH REDUCED PROCESSING DELAY

(75) Inventor: Sudhind Dhamankar, Santa Clara, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 549 days.

(21) Appl. No.: 10/282,524

(22) Filed: Oct. 29, 2002

(51) Int. Cl.
*H03M 13/00* (2006.01)
*H03M 13/03* (2006.01)
*G11C 29/00* (2006.01)

(52) U.S. Cl. .................. 714/755; 714/786; 714/702
(58) Field of Classification Search .......... 714/755, 714/702, 786
See application file for complete search history.

(56) References Cited

U.S. PATENT DOCUMENTS 6,353,900 B1* 3/2002 Sindhushayana et al. ... 714/701
6,668,343 B1* 12/2003 Kim et al. .................. 714/702
6,854,077 B1* 2/2005 Chen et al. ................. 714/702

* cited by examiner

Primary Examiner—Albert Decady
Assistant Examiner—Esaw Abraham
(74) Attorney, Agent, or Firm—Steve Mendelsohn; Yuri Gruzdkov

(57) ABSTRACT

A turbo encoder includes a memory for temporarily storing an incoming data sequence and an interleaved address generator (IAG) designed to generate a sequence of addresses corresponding to the interleaved data sequence. The IAG performs calculations based on the length of the incoming data sequence and is able to generate a first interleaved address by (or before) the time the incoming data sequence has completely shifted into the memory. As a result, the encoder begins to output encoded data substantially as soon as the corresponding incoming data have been received, thus substantially reducing the processing delay. In addition, each interleaved address can be generated on the fly as needed during data output. As a result, the entire set of interleaved addresses does not need to be stored, thus reducing the memory requirements for the encoder.

33 Claims, 12 Drawing Sheets

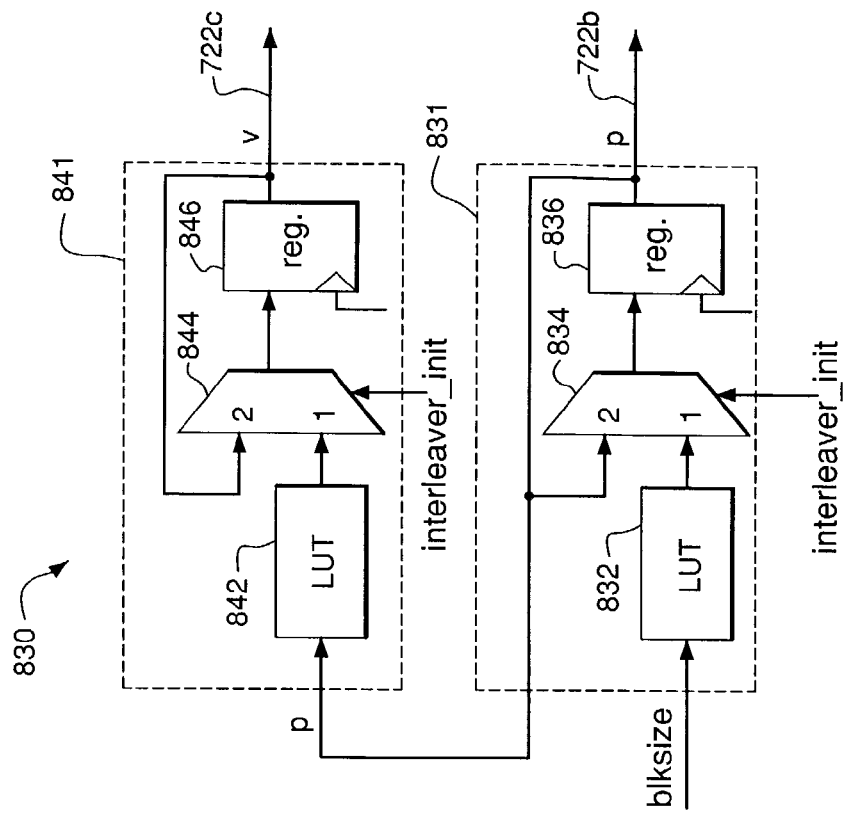
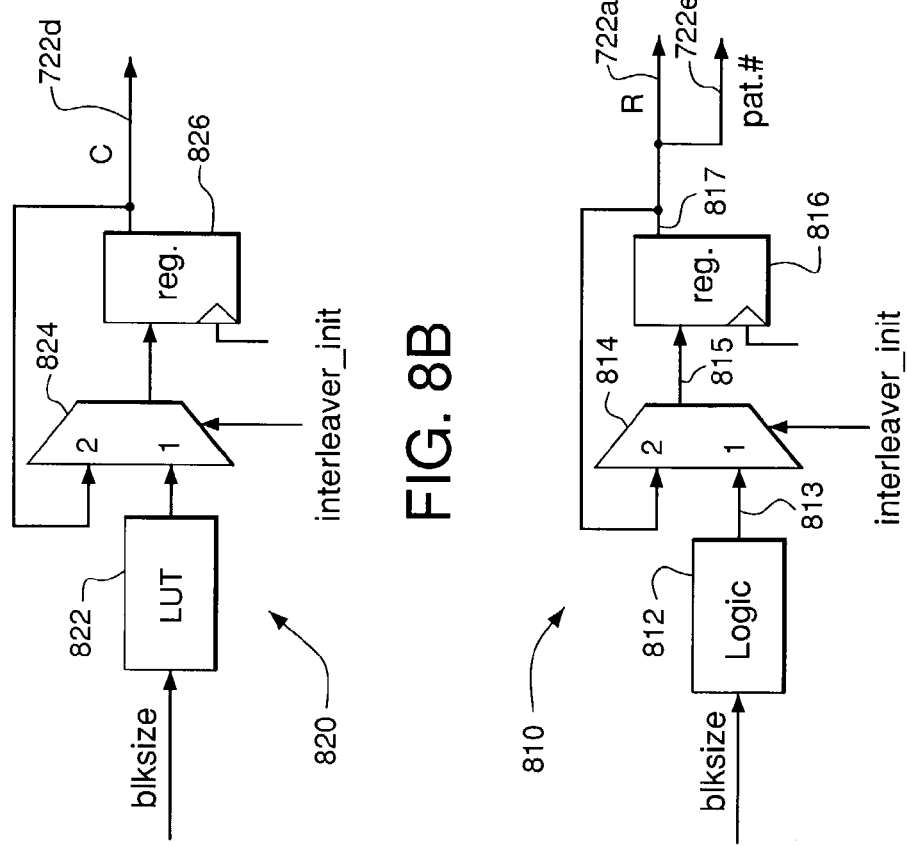
FIG. 8C
FIG. 8B
FIG. 8A

TURBO ENCODER WITH REDUCED PROCESSING DELAY

TECHNICAL FIELD

The present invention relates to communication equipment and, in particular, to third-generation (3G) wireless communication systems.

BACKGROUND

A turbo encoder is a standard component in, e.g., 3G wireless communication systems for Wideband Code Division Multiple Access (W-CDMA). A turbo encoder implements turbo convolutional coding (TCC), one type of which is recursive systematic convolutional coding, an advanced forward error correction algorithm. The encoder receives an input data stream (e.g., a digitized voice signal) and feeds into a communication channel (e.g., a wireless transmission link) an output data stream generated based on the input. The output data stream is a multiplexed stream including the input data stream and two (or more) encoded parity data streams. The parity streams carry the recursive encoded information about the input stream and provide redundancy for correcting errors, e.g., due to noise in the communication channel. In addition, one of the parity streams is generated using interleaving (i.e., reordering in a systematic way) to disperse burst errors, which makes them easier to correct at a receiver. The parity streams may optionally be punctured to save bandwidth.

FIG. 1 illustrates a representative turbo encoder 100 of the prior art. Encoder 100 includes two recursive systematic convolutional (RSC) encoders 102a–b, an interleaver 104, and a multiplexer (MUX) 106. Input data stream 110 (typically comprising a sequence of data packets (blocks) of variable size) is replicated to form three copies, with MUX 106, RSC encoder 102a, and interleaver 104 each receiving one copy. Interleaver 104 operates by receiving a payload of a data packet (data block) and pseudo-randomizing (interleaving) it, e.g., as specified in 3G Partnership Project Technical Specification Document (3GPP TS) 25.212 v.4.2.0. The interleaved data block is then fed into RSC encoder 102b. The outputs of encoders 102a–b and a copy of stream 110 are combined in MUX 106 to generate output data stream 120 of encoder 100.

One problem with encoder 100 is a substantial processing delay between the time a data block has been shifted in and the time the encoder can begin to output the corresponding multiplexed data stream. For example, for a data block that is K bits long, the processing delay may be about 2K clock cycles. In addition, encoder 100 is typically configured to generate and store a separate copy of the interleaved data block and/or corresponding addresses in addition to the originally received data block. This requires additional memory and may increase the chip area and cost for encoder 100.

SUMMARY

The problems in the prior art are addressed in accordance with the principles of the present invention by a turbo encoder with reduced processing delay. A turbo encoder of the present invention includes a memory for temporarily storing an incoming data sequence and an interleaved address generator (IAG) designed to generate a sequence of addresses corresponding to the interleaved data sequence. The IAG performs calculations based on the length of the incoming data sequence and is able to generate a first interleaved address by (or before) the time the incoming data sequence has completely shifted into the memory. As a result, the encoder can begin to output encoded data as soon as the corresponding incoming data have been received, thus substantially reducing the processing delay. In addition, each interleaved address can be generated on the fly as needed during data output. As a result, the entire set of interleaved addresses does not need to be stored, thus reducing the memory requirements for the encoder.

According to one embodiment, the present invention is a method for interleaving an incoming data sequence to generate an interleaved data sequence. A kernel array is generated based on the size of the incoming data sequence. Using the kernel array, a sequence of pointer arrays is recursively generating, each pointer array having elements corresponding to locations in the incoming data sequence. The interleaved data sequence is generated based on the elements in the sequence of pointer arrays.

According to another embodiment, the present invention is an apparatus for interleaving an incoming data sequence to generate an interleaved data sequence. The apparatus comprises a memory and an address generator. The memory is configured to receive an incoming data sequence. The address generator is configured to (a) generate a kernel array based on the size of the incoming data sequence; (b) recursively generate, using the kernel array, a sequence of pointer arrays, each pointer array having elements corresponding to locations in the incoming data sequence; and (c) address the memory to generate the interleaved data sequence based on the elements in the sequence of pointer arrays.

According to yet another embodiment, the present invention is a method of interleaving an incoming data sequence to generate an interleaved data sequence. The incoming data sequence is received at a memory. An address generator is enabled to generate a sequence of addresses corresponding to the interleaved data sequence, wherein the address generator is capable of generating the first address in the sequence before the entire incoming data sequence is received by the memory.

According to yet another embodiment, the present invention is an apparatus for interleaving an incoming data sequence to generate an interleaved data sequence. The apparatus comprises a memory and an address generator. The memory is configured to receive the incoming data sequence. The address generator is configured to generate a sequence of addresses corresponding to the interleaved data sequence and address the memory to output the interleaved data sequence, wherein the address generator is capable of generating the first address in the sequence before the entire incoming data sequence is received by the memory.

BRIEF DESCRIPTION OF THE DRAWINGS

Other aspects, features, and benefits of the present invention will become more fully apparent from the following detailed description, the appended claims, and the accompanying drawings in which:

FIGS. 8A–C show a schematic diagrams of a parameter-generating logic circuit that may be used in the generator of FIG. 7 according to one embodiment of the present invention;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 2:
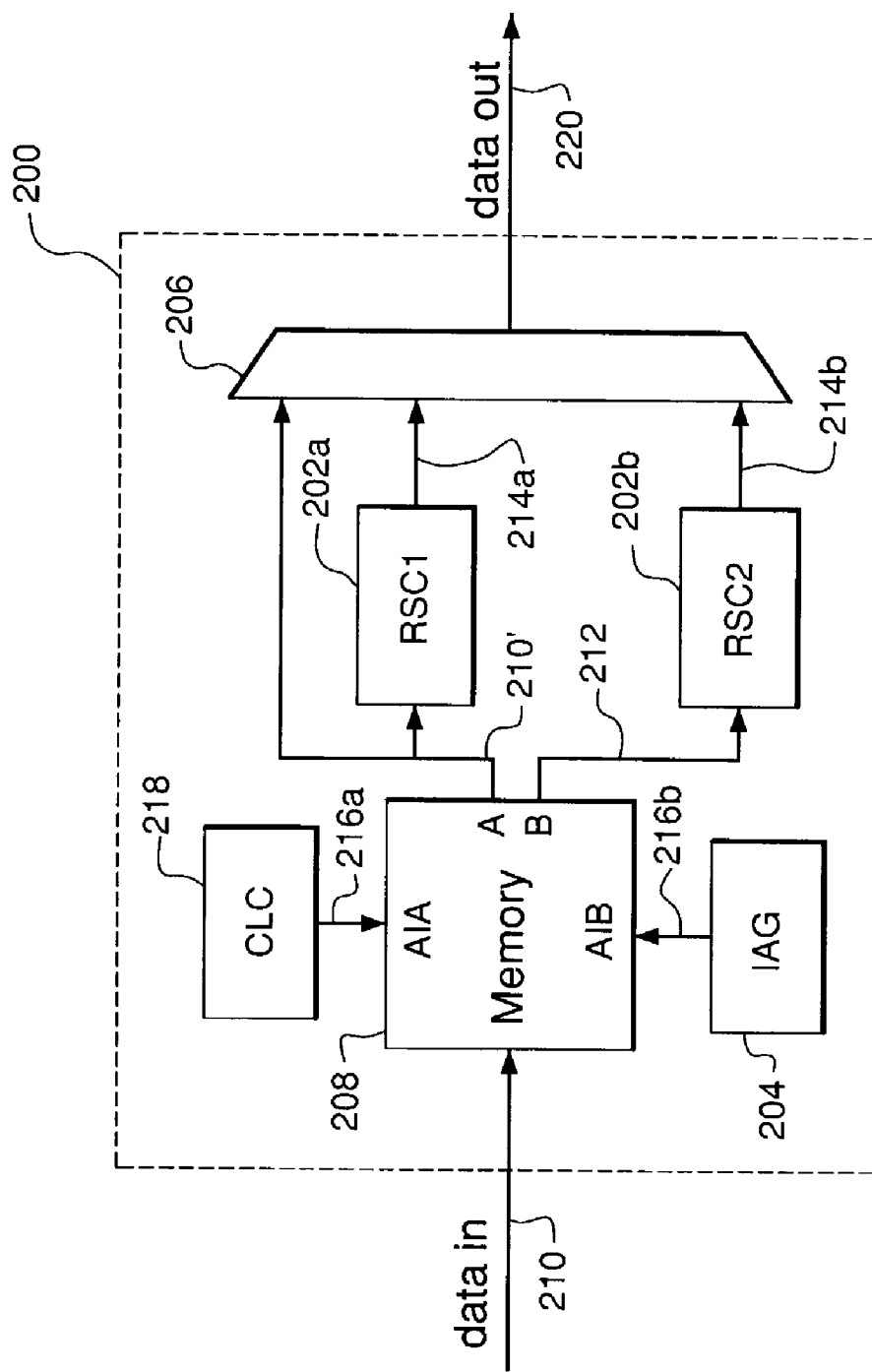
FIG. 2 shows a block diagram of a turbo encoder according to one embodiment of the present invention.

FIG. 2 illustrates a turbo encoder 200 according to one embodiment of the present invention. Encoder 200 includes a memory 208, two RSC encoders 202a–b, an interleaved address generator (IAG) 204, a control logic circuit (CLC) 218, and a MUX 206. RSC encoders 202a–b and MUX 206 of encoder 200 are similar to RSC encoders 102a–b and MUX 106, respectively, of encoder 100. In one embodiment, memory 208 is a dual-output-port RAM that has two output ports (labeled A and B in FIG. 2) and is designed to output two data bits per clock cycle, one bit per output port. The outputted bits may correspond to two different locations (addresses) in memory 208 or to the same address. The corresponding addresses are specified at two address inputs labeled AIA and AIB in FIG. 2 and corresponding to ports A and B, respectively. IAG 204 is a logic block designed to generate a sequence of addresses corresponding to an interleaved data block as will be further described below, while CLC 218 generates a sequence of un-interleaved addresses.

In one configuration, encoder 200 operates as follows. A data block of input data stream 210 is shifted into and temporarily stored in memory 208. Control logic circuit 218 and IAG 204 generate signals 216a and 216b, respectively, each of which represents a sequence of addresses corresponding to the data block stored in the memory. More specifically, signal 216a represents a sequence of addresses corresponding to the data in the order the data were received, and signal 216b represents a sequence of addresses corresponding to the interleaved data (hereafter termed the "interleaved addresses"). In addition, IAG 204 is designed such that it is ready to generate the interleaved addresses by (or before) the time the data block has completely shifted into the memory. Based on signals 216a–b, memory 208 outputs two data streams 210 and 212, the former corresponding to a copy of the original data block and the latter corresponding to a copy of the interleaved data block.

Figure 1:
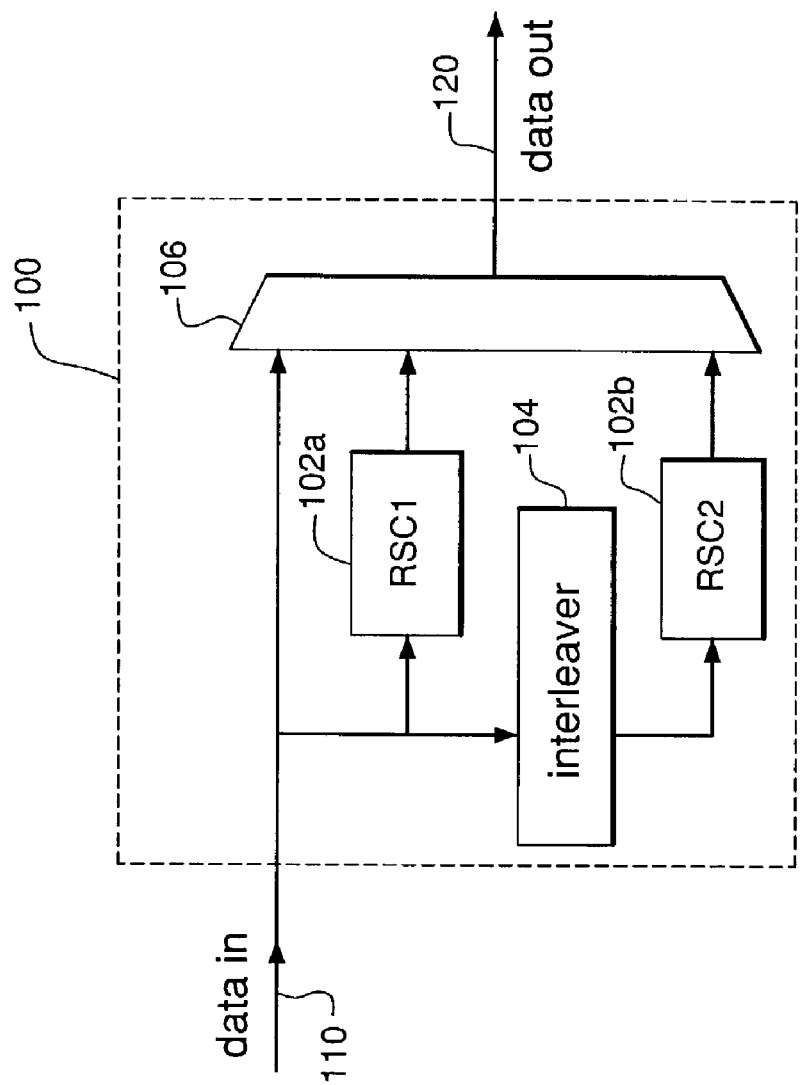
FIG. 1 shows a block diagram of a representative turbo encoder of the prior art.

Further operation of encoder 200 is similar to that of encoder 100 of FIG. 1. In particular, stream 210 is replicated to form two copies, one of which is applied to RSC encoder 202a with the other being applied to MUX 206. Stream 212 is applied to RSC encoder 202b. The outputs of the RSC encoders (streams 214a–b in FIG. 2) are then combined with the second copy of stream 210 using MUX 206 to generate stream 220, i.e., the output of encoder 200.

Advantageously, the present invention can be implemented with substantially smaller processing delays and area requirements than encoder 100. In particular, encoder 200 can be configured to begin outputting the encoded data substantially as soon as the corresponding original data have been received by the encoder, thus substantially reducing the processing delay. In addition, encoder 200 does not need to store a copy of the entire set of interleaved addresses but instead can be configured to generate them on the fly as needed during data output, thus reducing the area requirements for a chip implementing this encoder.

Figure 3:
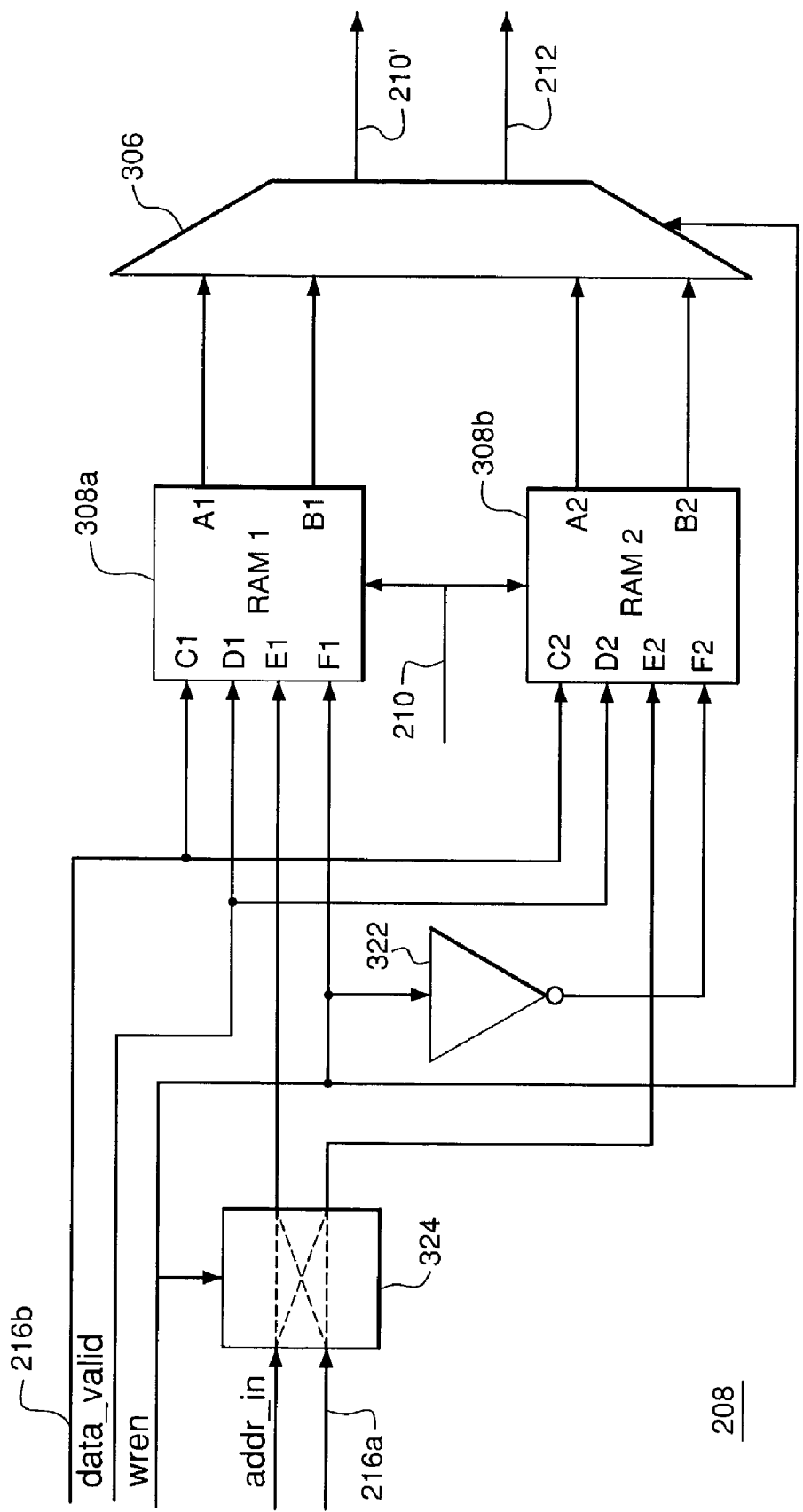
FIG. 3 shows a block diagram of a memory that can be used in the encoder of FIG. 2 according to one embodiment of the present invention.

FIG. 3 illustrates memory 208 according to one embodiment of the present invention. As shown in FIG. 3, memory 208 is designed to allow a simultaneous write/read operation. For this purpose, it includes two RAMs 308a–b, each of which is a dual-output-port RAM. The operation of each RAM 308a–b is controlled by control signals applied to control inputs, four of which designated C-F for each RAM (e.g., C1-F1 for RAM 308a and C2-F2 for RAM 308b) are shown in FIG. 3. Input F is a write-enable input. Data can be written into the RAM only when input F is "high". Input D asserts that there are valid data at input port I (e.g., I1 for RAM 308a and I2 for RAM 308b). Input E receives (i) the address to which a data bit is written during a write operation or (ii) the address of a data bit outputted at output port A (e.g., A1 for RAM 308a or A2 for RAM 308b) during a read operation. Input C receives the address of a data bit outputted at output port B (e.g., B1 for RAM 308a or B2 for RAM 308b) during a read operation.

A "write enable" signal labeled "wren" in FIG. 3 is applied (i) directly to input F1 of RAM 308a and (ii) through inverter 322 to input F2 of RAM 308b. Therefore, when signal "wren" goes high, data can be written to RAM 308a and not to RAM 308b. Similarly, when signal "wren" goes low, data can be written to RAM 308b and not to RAM 308a. In addition, signal "wren" controls the state of a routing switch 324 and the state of an output selector 306.

Switch 324 has two inputs and two outputs. In one implementation, when signal "wren" is high, switch 324 routes signal "addr_in" to input E1 and signal 216a to input E2. When signal "wren" is low, switch 324 routes signal "addr_in" to input E2 and signal 216a to input E1. Signal "addr_in" is generated by control logic (e.g., control logic circuit 218 of FIG. 2) and provides an address to which a data bit is written in the corresponding write-enabled RAM 308a–b.

Output selector 306 selects the outputs of either one of RAMs 308a–b (i.e., outputs A1/B1 or A2/B2) to be outputs 210 and 212 of memory 208, respectively. In one implementation, when signal "wren" is high, the outputs of RAM 308b are selected, and, when signal "wren" is low, the outputs of RAM 308a are selected.

Signal "data_valid" is generated by control logic (e.g., control logic circuit 218 of FIG. 2) and applied to inputs D1 and D2, and signal 216b is applied to inputs C1 and C2.

In one configuration, data can be simultaneously written to and read from memory 208. For example, when signal "wren" is high, data can be written to RAM 308a and read from RAM 308b, and, when signal "wren" is low, data can be written to RAM 308b and read from RAM 308a.

Before the structure and operation of interleaved address generator 204 according to certain embodiments of the present invention are described in detail, part of the 3GPP specification related to interleaving (e.g., as described in 3GPP TS 25.212 v.4.2.0) is briefly reviewed below.

According to the 3GPP specification, a TCC interleaver performs the following operations:

(A) transformation of an input data sequence (block) to a rectangular matrix with padding;

(B) inter-row and intra-row permutations of the rectangular matrix; and (C) output from the permuted rectangular matrix with pruning.

In describing these operations, the following symbol notation is followed:

K block size, where K is an integer and 40 K 5114;

R number of rows of the rectangular matrix;

C number of columns of the rectangular matrix;

p prime number;

v primitive root;

$(s(j))_{j \in \{0,1,\ldots,p-2\}}$ base sequence for intra-row permutation;

$q_r$ minimum prime integers;

$r_t$ permuted prime integers;

$(T(i))_{i \in \{0,1,\ldots,R-1\}}$ inter-row permutation pattern;

$(U_i(j))_{j \in \{0,1,\ldots,C-1\}}$ intra-row permutation pattern for the i-th row;

i index of row number of the rectangular matrix;

j index of column number of the rectangular matrix; and k index of bit sequence.

Figure 4:
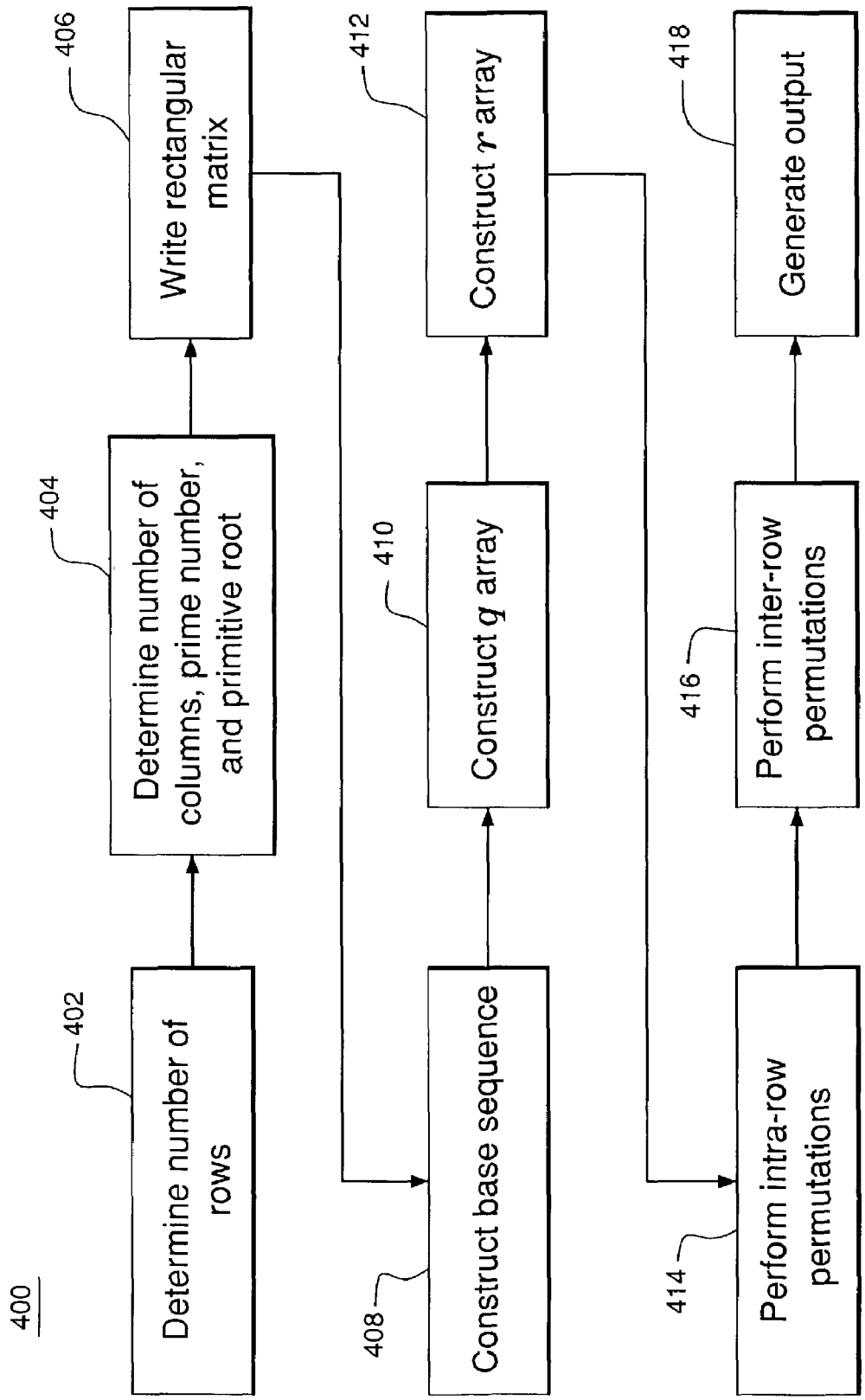
FIG. 4 shows a flowchart of a 3GPP-recommended method for TCC coding.

FIG. 4 shows a 3GPP-recommended method 400 for implementing operations (A)–(C). In particular, method 400 includes process blocks 402–418 as follows:

(i) In block 402, R is determined, such that:

$$R = \begin{cases} 5, & \text{if } (40 \leq K \leq 159) \\ 10, & \text{if } ((160 \leq K \leq 200) \text{ or } (481 \leq K \leq 530)) \\ 20, & \text{if } (K = \text{any other value}) \end{cases} \quad (1)$$

The rows of the rectangular matrix are numbered 0, 1, ..., R−1 from top to bottom.

(ii) In block 404, p, v, and C are determined, such that:

if (481%K%530), then p=53 and C=p     (2)

if K has a different value, then a minimum value of p is found from Table 1 to satisfy Equation (3) as follows:

K%R×(p+1)     (3)

then C is determined as follows:

$$C = \begin{cases} p-1 & \text{if } K \leq R \times (p-1) \\ p & \text{if } R \times (p-1) < K \leq R \times p \\ p+1 & \text{if } R \times p < K \end{cases} \quad (4)$$

and v is determined from Table 1 as the number indicated on the right side of the determined prime number p. The columns of the rectangular matrix are numbered 0, 1, ..., C−1 from left to right.

TABLE 1

List of prime numbers p and primitive roots v

| p | v |
|---|---|
| 7 | 3 |
| 11 | 2 |
| 13 | 2 |
| 17 | 3 |
| 19 | 2 |
| 23 | 5 |
| 29 | 2 |
| 31 | 3 |
| 37 | 2 |
| 41 | 6 |
| 43 | 3 |
| 47 | 5 |
| 53 | 2 |
| 59 | 2 |
| 61 | 2 |
| 67 | 2 |
| 71 | 7 |
| 73 | 5 |
| 79 | 3 |
| 83 | 2 |
| 89 | 3 |
| 97 | 5 |
| 101 | 2 |
| 103 | 5 |
| 107 | 2 |
| 109 | 6 |
| 113 | 3 |
| 127 | 3 |
| 131 | 2 |
| 137 | 3 |
| 139 | 2 |
| 149 | 2 |
| 151 | 6 |
| 157 | 5 |
| 163 | 2 |
| 167 | 5 |
| 173 | 2 |
| 179 | 2 |
| 181 | 2 |
| 191 | 19 |
| 193 | 5 |
| 197 | 2 |
| 199 | 3 |
| 211 | 2 |
| 223 | 3 |
| 227 | 2 |
| 229 | 6 |
| 233 | 3 |
| 239 | 7 |
| 241 | 7 |
| 251 | 6 |
| 257 | 3 |

(iii) In block 406, the input bit sequence (block) ($x_1$, $x_2, x_3, \ldots, x_K$) is organized into an R×C rectangular matrix, row by row starting with bit $y_1$ in column 0 of row 0:

$$\begin{bmatrix} y_1 & y_2 & y_3 & \cdots & y_C \\ y_{(C+1)} & y_{(C+2)} & y_{(C+3)} & \cdots & y_{2C} \\ \vdots & \vdots & \vdots & \cdots & \vdots \\ y_{((R-1)C+1)} & y_{((R-1)C+2)} & y_{((R-1)C+3)} & \cdots & y_{R \times C} \end{bmatrix} \quad (5)$$

where $y_k = x_k$ for $k=1, 2, \ldots, K$; and if $R \times C > K$, dummy bits are padded, such that, e.g., $y_k = 0$ for $k = K+1, K+2, \ldots, R \times C$.

The dummy bits are pruned away from the output of the rectangular matrix after the intra-row and inter-row permutations.

(iv) In block 408, base sequence $\{s(j)\}_{j \in \{0,1,\ldots,p-2\}}$ for intra-row permutation is constructed as follows:

$$s(0) = 1; \text{ and} \quad (6A)$$

$$s(j) = (v \times s(j-1)) \bmod p, \text{ where } j = 1, 2, \ldots, (p-2) \quad (6B)$$

(v) In block 410, the q array, $\{q_i\}_{i \in \{0,1,\ldots,R-1\}}$, is constructed as follows:

$$q_0 = 1; \text{ and} \quad (7A)$$

$q_i$ is chosen to be a least prime integer satisfying
$$Gcd(q_i, p-1) = 1 \quad (7B)$$

where $q_i > 6$; $q_i > q_{(i-1)}$, for each $i = 1, 2, \ldots, R-1$; and function Gcd (a, b) returns the greatest common divisor of a and b.

(vi) In block 412, the r array $\{r_i\}_{i \in \{0,1,\ldots,R-1\}}$ is constructed by permuting the q array such that:

$$r_{T(i)} = q_i, \text{ for } i = 0, 1, \ldots, R-1 \quad (8)$$

where $\{T(i)\}_{i \in \{0,1,\ldots,R-1\}}$ is an inter-row permutation pattern depending on K and selected from Table 2.

TABLE 2

Inter-row permutation patterns for a TCC interleaver

| Pattern # | K | R | Inter-row permutation patterns <T(0), T(1), ..., T(R − 1)> |
|---|---|---|---|
| 1 | (40 ≤ K ≤ 159) | 5 | <4, 3, 2, 1, 0> |
| 2 | (160 ≤ K ≤ 200) or (481 ≤ K ≤ 530) | 10 | <9, 8, 7, 6, 5, 4, 3, 2, 1, 0> |
| 3 | (2281 ≤ K ≤ 2480) or (3161 ≤ K ≤ 3210) | 20 | <19, 9, 14, 4, 0, 2, 5, 7, 12, 18, 16, 13, 17, 15, 3, 1, 6, 11, 8, 10> |
| 4 | K = any other value | 20 | <19, 9, 14, 4, 0, 2, 5, 7, 12, 18, 10, 8, 13, 17, 3, 1, 16, 6, 15, 11> |

(vii) In block 414, intra-row permutations are performed according to the following algorithm:

if (C=p), then $$U_i(j) = s((j \times r_i) \bmod (p-1)), \text{ for } j=0, 1, \ldots, (p-2); \text{ and}$$

$$U_i(j) = 0, \text{ for } j = p-1,$$

where $U_i(j)$ is the original bit position of j-th permuted bit of i-th row;

if (C=p+1), then $$U_i(j) = s((j \times r_i) \bmod (p-1)), \text{ for } j=0, 1, \ldots, (p-2);$$

$$U_i(j) = 0, \text{ for } j=p-1;$$

$$U_i(j) = p, \text{ for } j=p; \text{ and}$$

if (K=R×C), then exchange $U_{R-1}(p)$ with $U_{R-1}(0)$; and if (C=p−1), then $$U_i(j) = s((j \times r_i) \bmod (p-1)) - 1, \text{ for } j=0, 1, \ldots, (p-2).$$

(viii) In block 416, inter-row permutations are performed for the rectangular matrix based on pattern $\{T(i)\}_{i \in \{0,1,\ldots,R-1\}}$, where T(i) is the original row position of the i-th permuted row.

(ix) In block 418, output is read from the permuted rectangular matrix with pruning as follows. After the intra-row and inter-row permutations, the bits of the permuted rectangular matrix are denoted by $y'_k$:

$$\begin{bmatrix} y'_1 & y'_{(R+1)} & y'_{(2R+1)} & \cdots & y'_{((C-1)R+1)} \\ y'_2 & y'_{(R+2)} & y'_{(2R+2)} & \cdots & y'_{((C-1)R+2)} \\ \vdots & \vdots & \vdots & \cdots & \vdots \\ y'_R & y'_{2R} & y'_{3R} & \cdots & y'_{C \times R} \end{bmatrix} \quad (9)$$

The output is a bit sequence read out column by column from the rectangular matrix of Equation (9) starting with bit $y'_1$ in row 0 of column 0 and ending with bit $y'_{C \times R}$ in row R−1 of column C−1. The output is pruned by deleting the dummy bits that were padded to the initial rectangular matrix (Equation 5) before the intra-row and inter row permutations, i.e. bits $y'_k$, that correspond to bits $y_k$ with k>K are removed from the output. The output bits are denoted by $x'_1, x'_2, \ldots, x'_K$, where $x'_1$ corresponds to the bit $y'_k$ with the smallest index k after pruning, $x'_2$ to the bit $y'_k$ with the second smallest index k after pruning, etc. The number of output bits is K, and the number of pruned bits is R×C−K.

As indicated by the above description, blocks 402–418 of method 400 may include a substantial amount of computation and, therefore, cause a corresponding processing delay in the encoder (e.g., encoder 100 of FIG. 1). However, according to embodiments of the present invention, IAG 204 of encoder 200 is designed to implement a method for generating interleaved addresses corresponding to the 3GPP specification in an innovative way such that, for any given K, a number of clock cycles used by IAG 204 to become ready for serially outputting the interleaved addresses is equal to or less than K. As a result, encoder 200 can be configured to begin outputting the encoded data substantially as soon as a data block has completely shifted in, thus, significantly reducing the processing delay.

Figure 5:
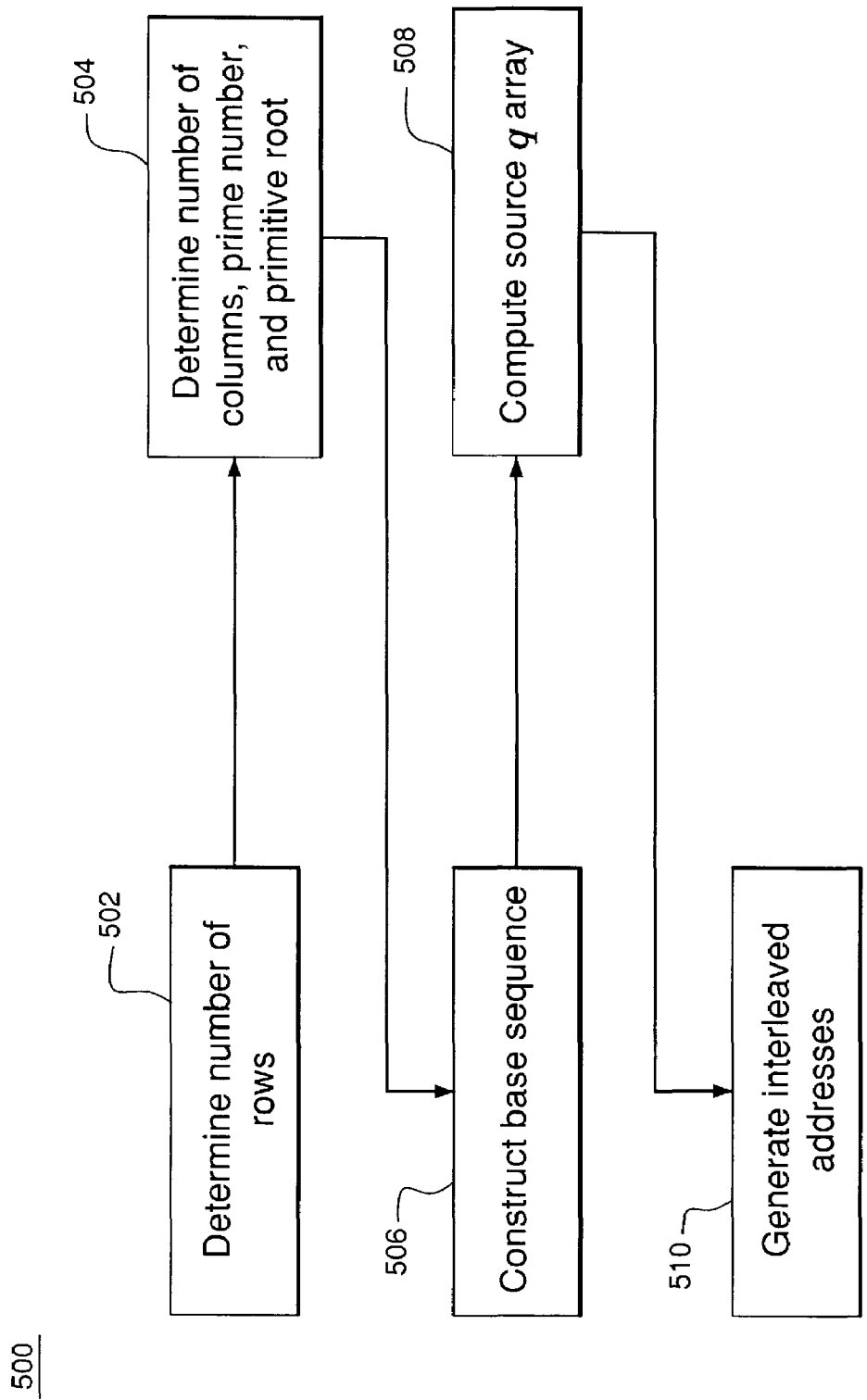
FIG. 5 shows a flowchart of a method for generating interleaved addresses that may be used in the encoder of FIG. 2 according to one embodiment of the present invention.

FIG. 5 illustrates a method 500 for generating interleaved addresses that may be used in encoder 200 according to one embodiment of the present invention. More specifically, method 500 includes process blocks 502–510 as follows:

(I) In block 502, R is determined;
(II) In block 504, p, v, and C are determined;
(III) In block 506, base sequence s(j) is constructed;
(IV) In block 508, a "source q array" is constructed; and
(V) In block 510, a sequence of interleaved addresses is generated.

Note that, in blocks 502 and 504, R, p, and C are determined based on K, while v is determined based on the value of p. As such, in alternative implementations of method 500, the functionality of blocks 502 and 504 can be grouped differently (e.g., the determination of R, p, and C based on K, followed by the determination of v based on p.

In one embodiment, blocks 502–506 of method 500 are similar to blocks 402, 404, and 408, respectively, of method 400. However, as is further detailed below, the concept of "source q array" utilized in block 508 is novel and is introduced in method 500 to reduce the amount of computation compared to blocks 410–416 of method 400. The source q array is a function of K and, once computed, it can be used repeatedly, e.g., for a string of data blocks having the same size. In addition, the source q array is used as a kernel for incrementing a pointer array (labelled C array and described in more detail below), which is used for the calculation of the interleaved addresses corresponding to the current column being read out from the permuted rectangular matrix (Equation (9)). In one embodiment, the source q array is recomputed only when the block size (K) changes. In one embodiment, the sequence of interleaved addresses of block 510 is not stored and each interleaved address is generated on the fly, as needed during data output.

It is known in the art that modulus calculations may be rather expensive in terms of time and/or chip area. In one embodiment, block 506 is implemented using a recursive method, which reduces the time and/or area overhead. More specifically, the following recursive formulae are used:

$$s(0)=1 \quad (10A)$$

$$s(j)=v \times s(j-1), \text{ if } v \times s(j-1) < p \quad (10B)$$

$$s(j)=v \times s(j-1)-p, \text{ if } p < v \times s(j-1) < 2p \quad (10C)$$

$$\ldots$$

$$s(j)=v \times s(j-1)-np, \text{ if } np < v \times s(j-1) < (n+1)p \quad (10D)$$

where n is a positive integer. Calculations corresponding to Equations (10A–D) are carried out, e.g., by calculating the value of $v \times s(j-1)$ and then, if necessary, successively subtracting from it the value of p, while comparing the result of each subtraction with p.

In contrast with method 400 of FIG. 4, method 500 does not have an explicit process block for calculating the q array analogous to block 410 in method 400. Instead, method 500 utilizes the definition of $q_t$, e.g., given by Equations (7A–B). In one embodiment, the q array is selected using the appropriate R values from the following string, P(20), of prime numbers:

$$P(20)=<1,7,11,13,17,19,23,29,31,37,41,43,47,53,59, \\ 61,67,71,73,79> \quad (11)$$

In another embodiment, the q array is obtained by (a) assigning $q_0=1$ and (b) retrieving the next R-1 values from Table 1, column p.

In one embodiment, the calculation of source q array ($q_t$) in block 508 is performed recursively as follows:

$$q'_0=1 \quad (12A)$$

$$q'_i=(q_i-q_{i-1}+q'_{i-1})\bmod(p-1), \text{ for } i=1, 2, \ldots, R-1 \quad (12B)$$

In one embodiment, the modulus calculation corresponding to Equation (12B) is carried out analogously to that of Equations (10A–D).

Figure 6:
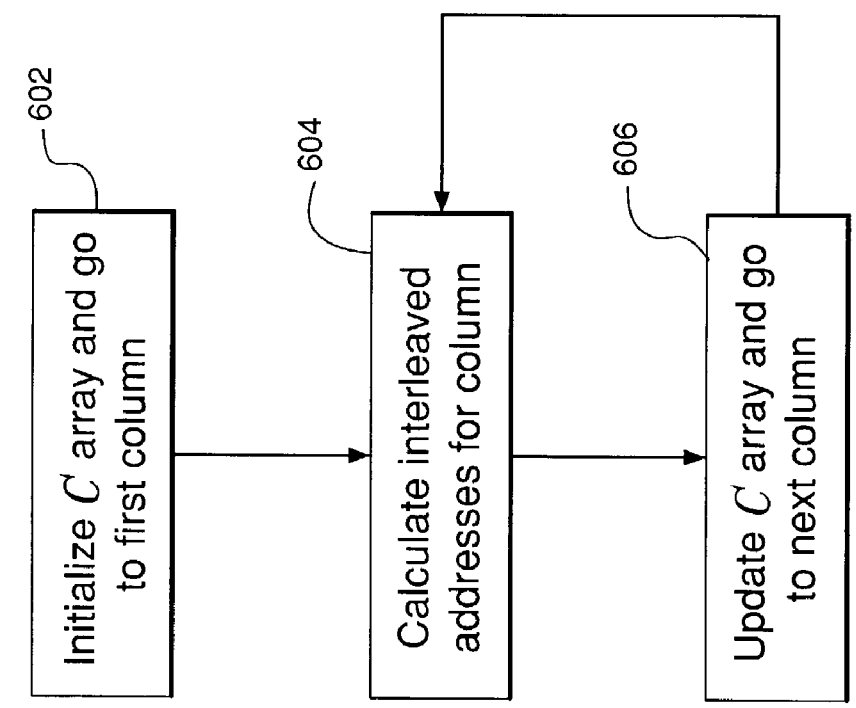
FIG. 6 shows a flowchart of a process block of computing a sequence of interleaved addresses in the method of FIG. 5 according to one embodiment of the present invention.

FIG. 6 shows block 510, comprising blocks 602–606 according to one embodiment of the present invention. As shown in FIG. 6, blocks 602–606 implement a recursive method for generating a sequence of interleaved addresses, $k_j(i)$, using: (a) the inter-row permutation pattern, T(i), corresponding to the block size (K) and found, e.g., in Table 2; (b) the base sequence generated in block 506; and (c) a "C array". The C array is a pointer array, which has R elements, $C_t^j$ (i=0, 1, 2, . . . , R-1), each element corresponding to an element in the j-th column of the permuted matrix of Equation (9).

In block 602, the C array is initialized by setting the column counter (j) to zero and all $C_t^0=0$. In block 604, the interleaved address corresponding to the i-th element of the j-th column is calculated according to the following expression:

$$k_j(i)=CT(i)+s(C_t^j) \quad (13)$$

Each $k_j(i)$ is then compared with K and an address is pruned, if $k_j(i)>K$. In block 606, the column counter is incremented and the C array is updated using the source q array calculated in block 508 as follows:

$$C_t^{j+1}=(C_t^j+q'_t)\bmod(p-1) \quad (14)$$

Blocks 604 and 606 are then repeated to generate the interleaved addresses corresponding to each column. As indicated by the foregoing, in the recursive implementation of block 510 illustrated by FIG. 6, the interleaved addresses are generated serially, in the order needed for constructing the interleaved data sequence.

Figure 7:
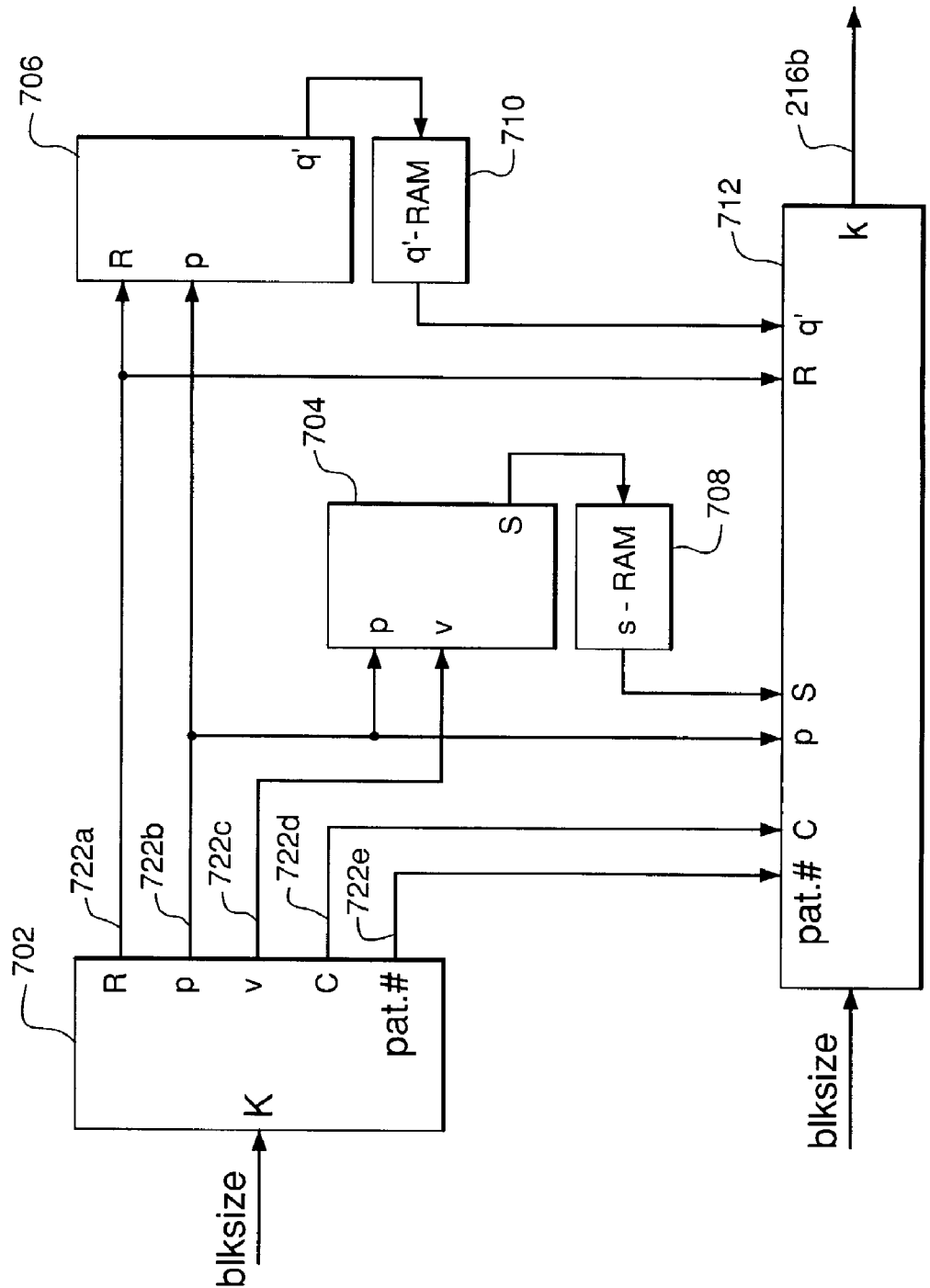
FIG. 7 shows a block diagram of an interleaved address generator that may be used in the encoder of FIG. 2 according to one embodiment of the present invention.

FIG. 7 illustrates IAG 204 according to one embodiment of the present invention. IAG 204 comprises four logic circuits 702, 704, 706, and 712 and two memory blocks 708 and 710. Circuit 702 is a parameter-generating circuit receiving an input signal labeled "blksize" and generating five output signals 722a–e. Signal "blksize" is a 13-bit signal corresponding to K (ranging from 40 to 5114) and can be generated, e.g., using the header information of a data packet. Outputs 722a–e correspond to R, p, v, C, and an inter-row permutation pattern number (e.g., indicated in Table 2), respectively. Circuit 704 is a base-sequence-generating circuit receiving signals 722b–c from circuit 702 and serially generating base sequence s(j), which is stored in memory 708. Circuit 706 is a source-q-array-generating circuit receiving signals 722a–b from circuit 702 and serially generating array $q'_t$, which is stored in memory 710. Circuit 712 is an interleaved-address-generating circuit receiving signals 722a,b,d,e from circuit 702 and "blksize" and accessing base sequence s(j) stored in memory 708 and array $q'_t$ stored in memory 710. Based on the inputs, circuit 712 generates a sequence of interleaved addresses (i.e., signal 216b).

In one embodiment, logic circuits 704 and 706 are designed to complete the generation of sequence s(j) and array $q'_t$ in less than K clock cycles for any K ranging from 40 to 5114. As a result, logic circuit 712 is ready to apply signal 216b to memory 208 of FIG. 2 by (or before) the time a data block has completely shifted into memory 208. In one implementation, each memory 708 and 710 is a RAM having two memory sub-blocks, e.g., corresponding to RAMs 308a–b (FIG. 3) of memory 208. In particular, each first memory sub-block is configured to store the information (i.e., sequence s(j) or array $q'_t$) corresponding to the data of RAM 308a. Similarly, each second memory sub-block is configured to store the information corresponding to the data of RAM 308b.

FIGS. 8A–C show schematic diagrams of different circuits in logic circuit 702 of FIG. 7 according to one embodiment of the present invention. Circuit 702 includes circuits 810, 820, and 830, each of which receives signal "blksize" as an input. Based on this input, circuit 810 generates signals 722a,e; circuit 820 generates signal 722d; and circuit 830 generates signals 722b–c.

Circuit 810 (FIG. 8A) includes a combinational logic circuit 812, a selector 814, and a register 816. Signal "blksize" is applied to circuit 812, which has a set of comparators configured to compare K with the following numbers: 159, 200, 481, 530, 2281, 2480, 3161, and 3210. Based on the comparisons, a range (i.e., one of the ranges indicated in Table 2), to which K belongs, is determined, and a 7-bit signal 813 is generated. In one embodiment, the first five bits of signal 813 correspond to R (which can be 5, 10, or 20) and the last two bits correspond to the pattern number (which can take values 1–4 as indicated in Table 2). For example, if K=500, then R=10 and the pattern number is 2. Similarly, if K=1000, then R=20 and the pattern number is 4.

Selector 814 has two inputs, each of which, based on a control signal (labeled "interleaver_init" in FIG. 8), can be selected to be signal 815. For example, when signal "interleaver_init" is high, a first input is selected, and, when signal "interleaver_init" is low, a second input is selected. In one configuration, signal "interleaver_init" becomes high when signal "blksize" changes, i.e., when K has changed. In that case, signal 813 is latched onto register 816, the output of which (signal 817) is parsed to produce signals 722$a$ (R) and 722$e$ (pattern number). In addition, signal 817 is fed back and applied to a second input of selector 814. As a result, when signal "interleaver_init" is low, signal 817 is selected, and signals 722$a$ and 722$e$ remain unchanged.

Circuit 820 (FIG. 8B) includes a look-up table (LUT) 822, a selector 824, and a register 826. Selector 824 and register 826 are analogous to selector 814 and register 816 of circuit 810. LUT 822 uses signal "blksize" as an address and generates a 9-bit output corresponding to C. This output is then processed by selector 824 and register 826 to generate signal 722$d$.

Circuit 830 (FIG. 8C) includes cascaded circuits 831 and 841, each of which is analogous to circuit 820. More specifically, in circuit 831, LUT 832 uses signal "blksize" as an address and generates a 9-bit output corresponding to p. This output is then processed by selector 834 and register 836 to generate signal 722$b$. In addition, the output of register 836 is used as an input signal for LUT 842 of circuit 841. Based on this input, LUT 832 generates a 5-bit output corresponding to v, which is then processed by selector 844 and register 846 to generate signal 722$c$.

Figure 9:
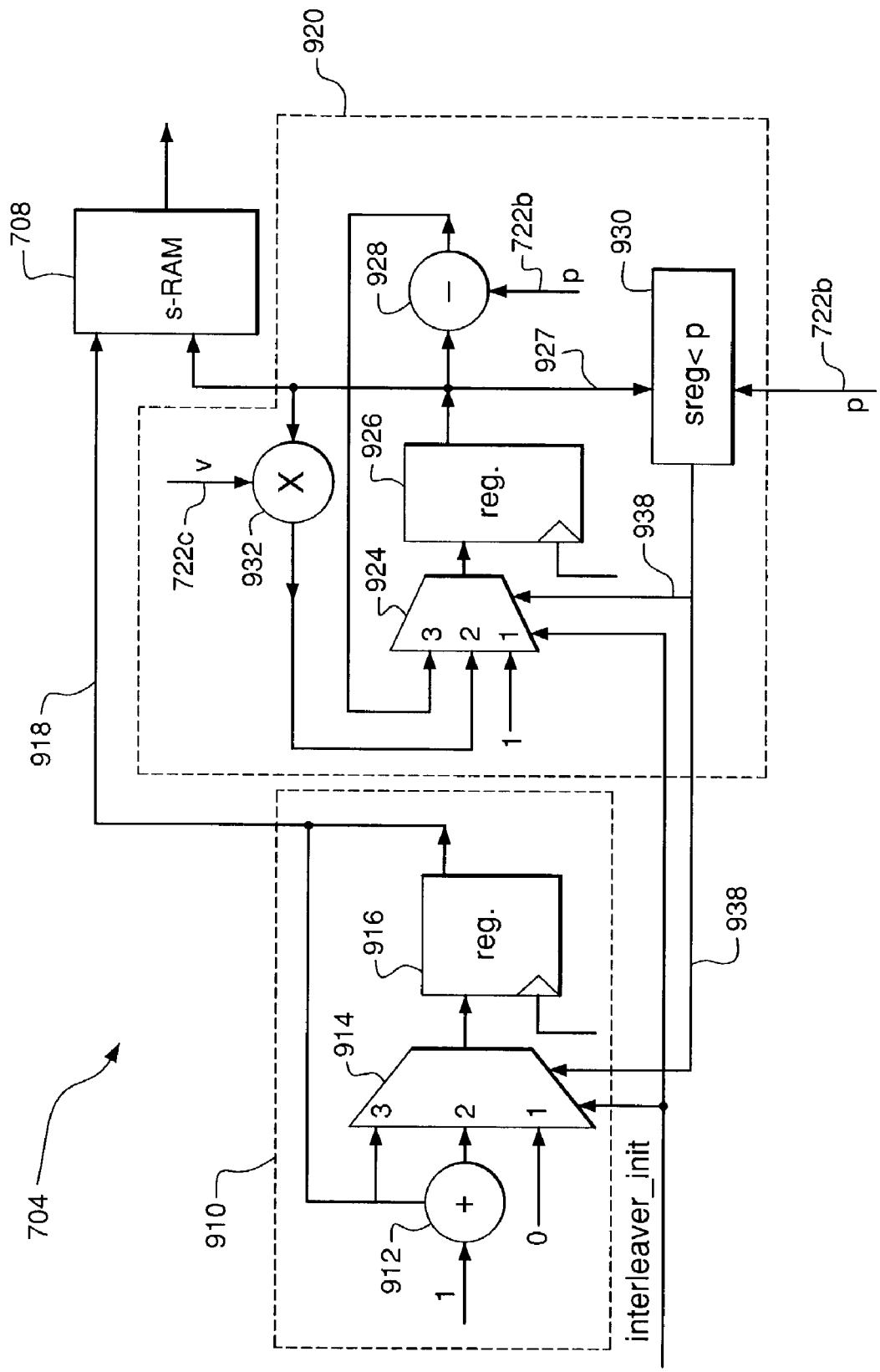
FIG. 9 shows a schematic diagram of a base-sequence-generating logic circuit that may be used in the generator of FIG. 7 according to one embodiment of the present invention.

FIG. 9 shows a schematic diagram of logic circuit 704 of FIG. 7 according to one embodiment of the present invention. Circuit 704 comprises a counter 910 and a logic circuit 920. The output of counter 910 (signal 918) is applied to memory 708 and provides an address, to which a value of s calculated by circuit 920 is written in that memory.

In one embodiment, counter 910 includes an adder 912, a selector 914, and a register 916 and can be configured to count from 0 to 256. Selector 914 has three inputs, each of which can be selected based on two control signals, i.e., signal 938 generated by circuit 920 and signal "interleaver_init" (described above). In one configuration, a first input of selector 914 is selected when signal "interleaver_init" is high, which latches a zero onto register 916 and initializes counter 910. When signal "interleaver_init" is low, a second or third input is selected based on signal 938. For example, in one configuration, when signal 938 is high, the second input coupled to adder 912 is selected, which advances the counter and latches an incremented counter value onto register 916. Alternatively, when signal 938 is low, the third input is selected, which keeps the counter value unchanged.

In one embodiment, circuit 920 comprises a selector 924, a register 926, a subtractor 928, a comparator 930, and a multiplier 932. Selector 924 is controlled by signal 938 and signal "interleaver_init" and is similar to selector 914. Signal 938 is generated by comparator 930 based on signals 927 and 722$b$. For example, if the value corresponding to signal 927 is greater than p, then signal 938 is low, and, if the value corresponding to signal 927 is less than p, then signal 938 is high.

In one configuration, circuit 920 implements a serial calculation of base sequence s(j) of method 500 (block 506) according to Equations (10A–D). More specifically, element s(0)=1 is generated by selecting a signal applied to input "1" of selector 924. Serial calculation of the remaining elements of sequence s(j) is then performed as follows. A product (sreg×v) of the value currently saved in register 926 (sreg) and the value of v (signal 722$c$) is generated using multiplier 932, and the result is latched onto register 926 via selector 924. It is then compared with p using comparator 930. If the result is less than p, then sreg is saved in memory 708 and counter 910 is incremented. If the result is greater than p, then the value of p is subtracted using subtractor 928 and the result of the subtraction is latched onto register 926 as a new value of sreg. This operation is repeated until sreg becomes less than p, after which it is saved in memory 708 and counter 910 is incremented. The serial calculation continues until all s(j) values have been calculated and saved in memory 708.

Figure 10:
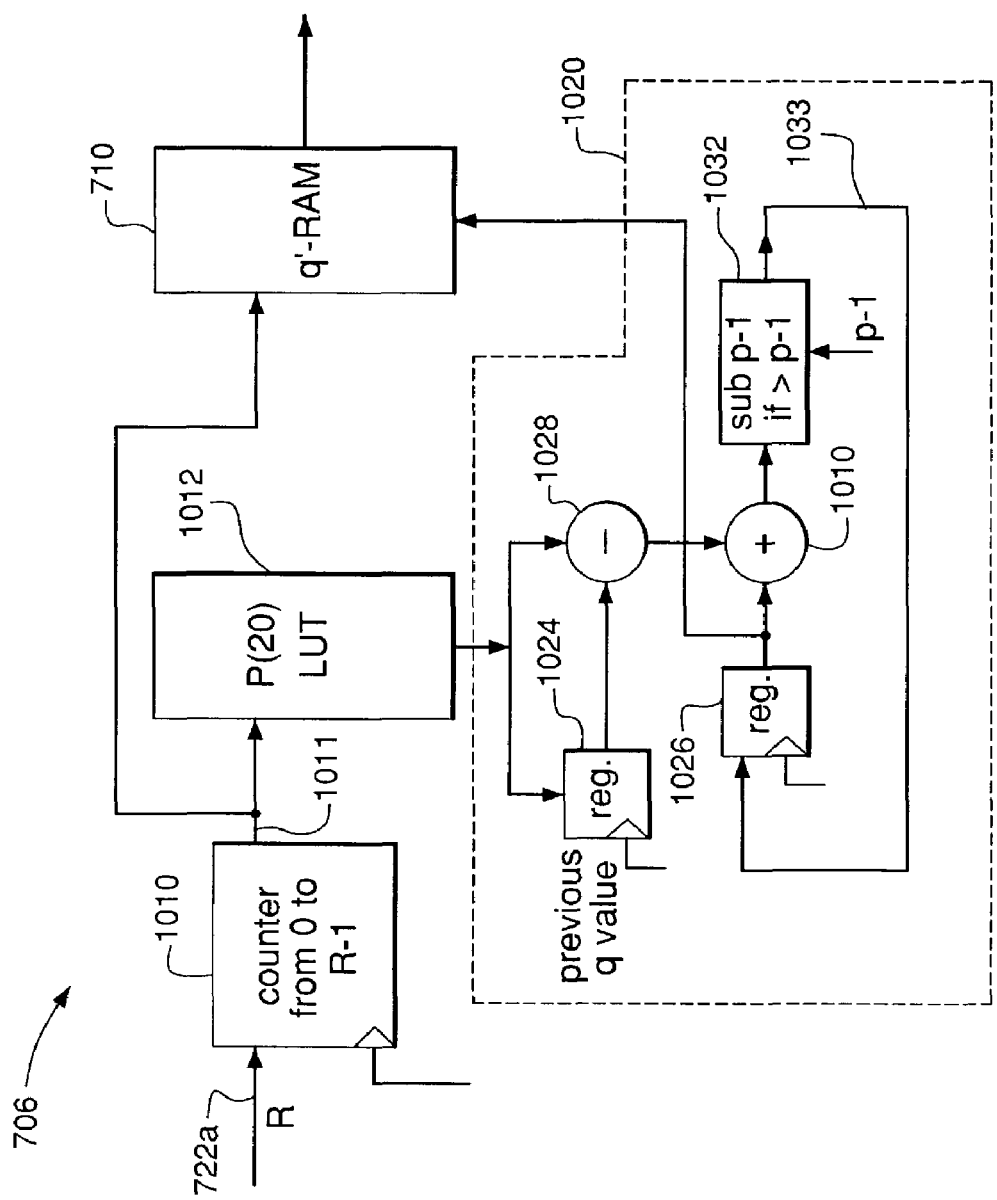
FIG. 10 shows a schematic diagram of a source-q-array-generating logic circuit that may be used in the generator of FIG. 7 according to one embodiment of the present invention.

FIG. 10 shows a schematic diagram of logic circuit 706 of FIG. 7 according to one embodiment of the present invention. Circuit 706 comprises a (0 to R−1) counter 1010, an LUT 1012, and a logic circuit 1020. The output of counter 1010 (signal 1011) is applied to LUT 1012 and to memory 710. LUT 1012 stores string P(20) given by Equation (11), and signal 1011 is used as an address to retrieve the corresponding element of P(20). In addition, signal 1011 provides an address in memory 710, at which a value of q'$_t$ calculated by circuit 1020 is stored.

In one embodiment, circuit 1020 comprises registers 1024 and 1026, a subtractor 1028, an adder 1030, and a logic circuit 1032. In one configuration, circuit 1020 implements a serial calculation of array q'$_t$ of method 500 (block 508) according to Equations (12A–B). More specifically, at the start of the calculation, registers 1024 and 1026 are reset to store zeros. As a result, the first value stored in LUT 1012 (q$_0$=1) will be shifted into memory 710 to initialize array q'$_t$ at 1. Serial calculation of the remaining elements of array q'$_t$ is then performed as follows. Using subtractor 1028, a previous value of q stored in register 1024 is subtracted from a new value of q retrieved from LUT 1012. In addition, the retrieved value of q is latched onto register 1024 to replace the previously stored value. Then, the result of the subtraction is added to the previous value of q' stored in register 1026, and the result of the addition is applied to logic circuit 1032. Circuit 1032 is designed to perform a modulus calculation on the input in a manner described by Equations (10A–D) and implemented, e.g., by circuit 920 of FIG. 9. In one embodiment, circuit 1032 has a register, comparator, and subtractor connected and operating analogously to register 926, comparator 930, and subtractor 928 of circuit 920. As a result, the output of circuit 1032 (signal 1033) corresponds to the calculation of Equation (12B). Signal 1033 is latched onto register 1026 and, at the next cycle, shifted into memory 710 to produce a next element of array q'. The serial calculation continues until all q'$_t$ values have been calculated and saved in memory 710.

Figure 11:
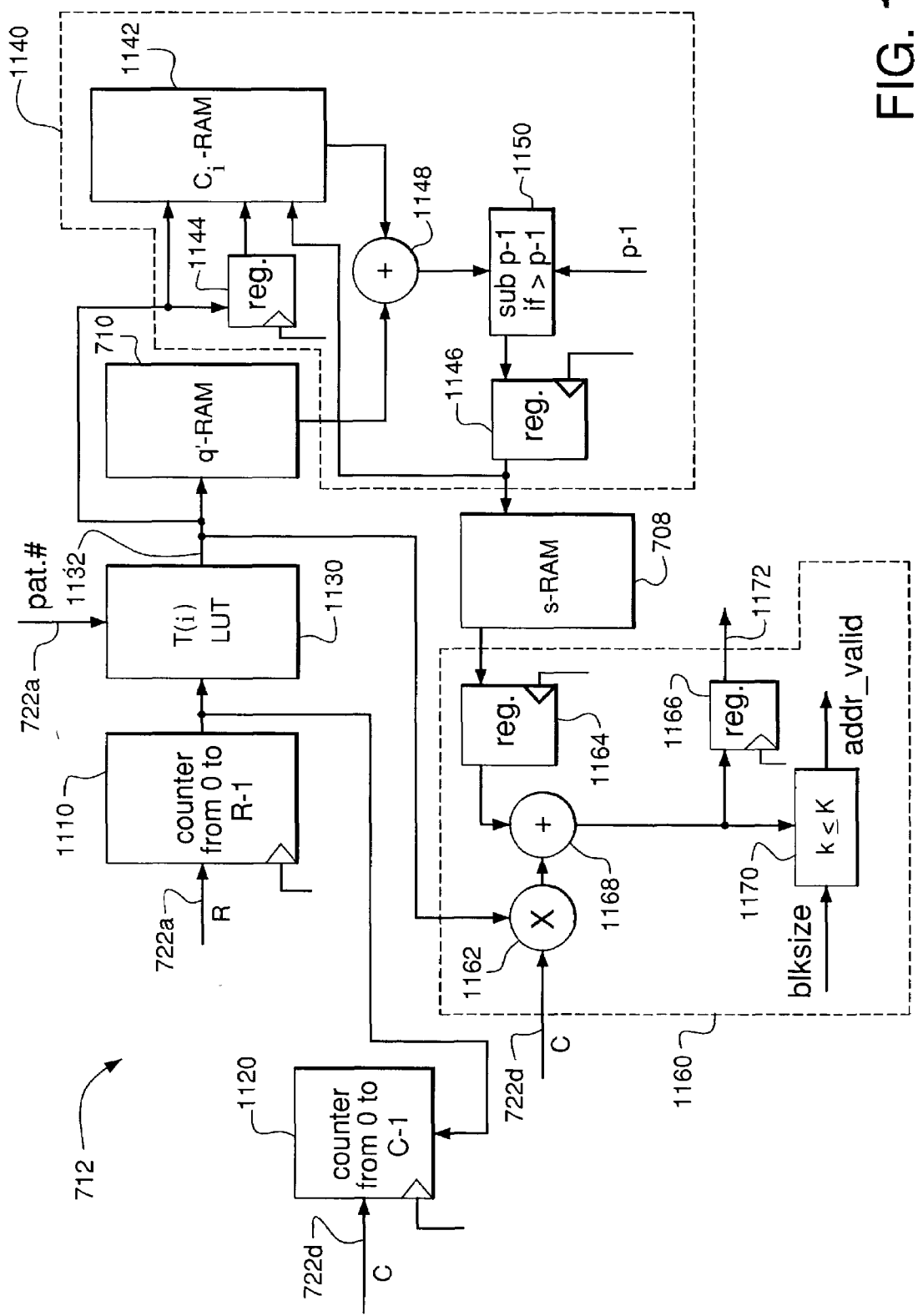
FIG. 11 shows a schematic diagram of an interleaved-address-generating logic circuit that may be used in the generator of FIG. 7 according to one embodiment of the present invention.

FIG. 11 shows a schematic diagram of logic circuit 712 of FIG. 7 according to one embodiment of the present invention. Circuit 712 comprises counters 1110 and 1120, an LUT 1130, and logic circuits 1140 and 1160. Counters 1110 and 1120 correspond to the rows and columns, respectively, of the permuted rectangular matrix of Equation (9). Counter 1110 is a master cyclic counter configured to count from 0 to R−1. Counter 1120 is a slave counter configured to count from 0 to C−1 and is incremented when counter 1110 has completed a cycle. LUT 1130 stores the inter-row permutation patterns (T(i)) of Table 2. An appropriate pattern is selected based on signal 722e, and a particular value of T(i) is outputted as signal 1132 using the output of counter 1110 as an address. Circuit 1140 is designed to calculate the C array according to Equation (14), and circuit 1160 is designed to generate a sequence of interleaved addresses (signal 216b) according to Equation (13).

In one embodiment, circuit 1140 comprises a memory 1142, registers 1144 and 1146, an adder 1148, and a logic circuit 1150. In one configuration, circuit 1140 implements a serial calculation of the C array as follows. Signal 1132 is applied to each of memory 710 and memory 1142 as an address to retrieve the corresponding values of $q'_t$ and $C_t^j$, respectively. In addition, signal 1132 is latched onto register 1144. The retrieved values of $q'_t$ and $C_t^j$ are summed using adder 1148, and the result of summation is applied to circuit 1150. Circuit 1150 is similar to circuit 1032 of FIG. 10 and performs a modulus calculation (as described above), thus completing a calculation corresponding to Equation (14). The output of circuit 1150 is latched onto register 1146 and, at the next clock cycle, applied to memory 708 and memory 1142. Memory 1142 stores the output of register 1146 at the address provided by register 1144, thus replacing the previously retrieved value of $C_t^j$. Memory 708 uses the output of register 1146 as an address to output the corresponding value of $s(C_t^j)$ and apply it to circuit 1160.

In one embodiment, circuit 1160 comprises a multiplier 1162, registers 1164 and 1166, an adder 1168, and a comparator 1170. In one configuration, circuit 1160 implements a serial generation of interleaved addresses as follows. Signals 1132 and 722d are applied to multiplier 1162, which generates a value corresponding to the term "CT(i)" in Equation (13). The output of multiplier 1162 is then summed with the value of $s(C_t^j)$ transferred to register 1164 from memory 708. The output of adder 1168 is latched onto register 1166 and applied to comparator 1170. Comparator 1170 generates signal "addr_valid" asserting that register 1166 has an interleaved address corresponding to a valid data bit and not to a dummy bit. For example, if a value of the interleaved address is less than or equal to K, signal "addr_valid" goes high, and the corresponding data bit will be outputted from memory 208 (FIG. 2) at output port B. On the other hand, if a value of the interleaved address is greater than K, signal "addr_valid" goes low and the address will be ignored. In one embodiment, signal 1172 (the output of register 1166) is used as signal 216b (FIG. 2). In another embodiment, logic circuit 712 includes additional circuitry that receives signal 1172 and provides signal 216b. One possible implementation of such additional circuitry is described below in reference to FIG. 12.

The rate for TCC encoders, such as encoder 200 of FIG. 2, is ⅓, meaning that one data bit and two parity bits are outputted before the next bit is encoded. As such, circuit 712 has three clock cycles to generate a valid interleaved address without disrupting the continuity of the encoder's output (e.g., signal 220 for encoder 200). Since the permuted rectangular matrix (Equation (9)) generated according to the 3GPP specification is such that there are no two consecutive dummy bits in the readout, circuit 712 will need a maximum of two clock cycles to produce each valid interleaved address, thus enabling continuous output from encoder 200.

Figure 12:
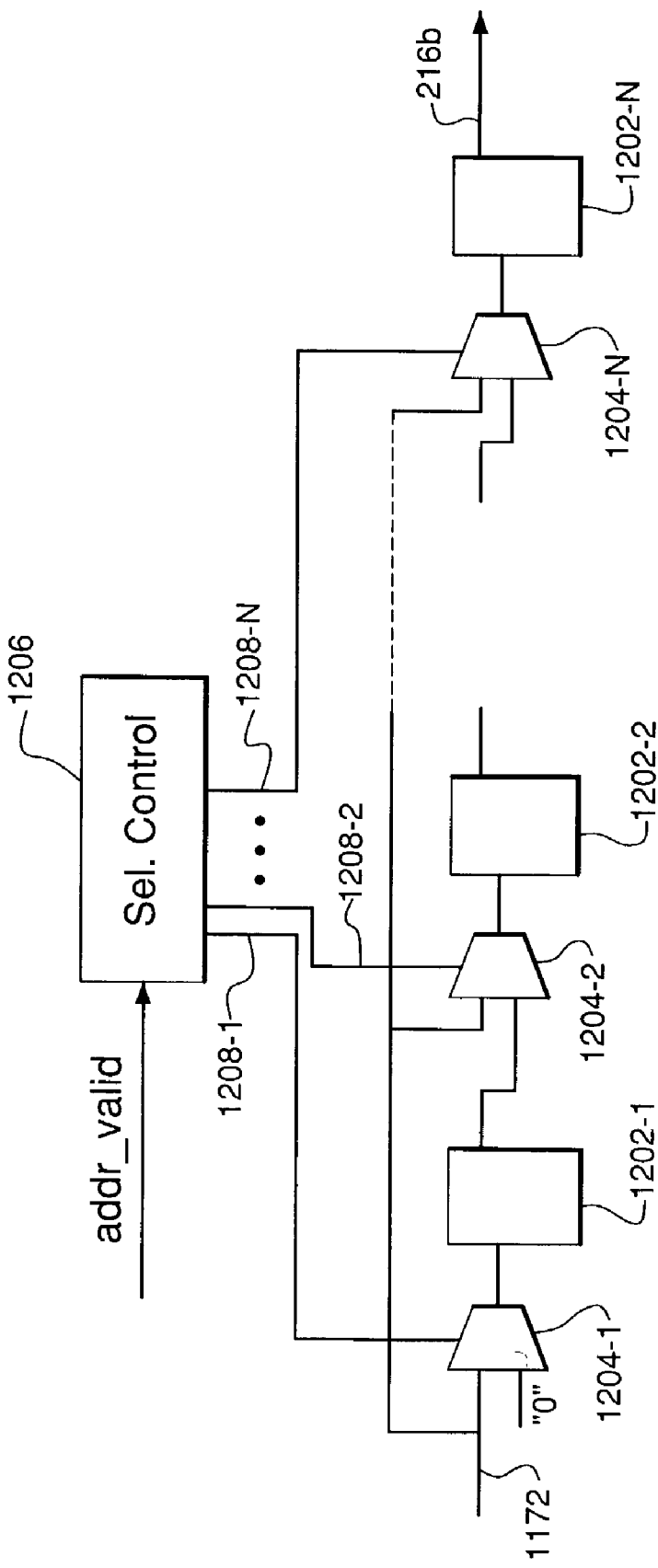
FIG. 12 shows a buffer that can be used in the generator of FIG. 7 according to one embodiment of the present invention.

FIG. 12 shows a buffer 1200 that can be used in logic circuit 712 according to one embodiment of the present invention. In particular, buffer 1200 can be used if (1) encoder 200 is configured to puncture parity bits from the output and (2) circuit 712 is to produce each valid interleaved address in fewer clock cycles (e.g., one clock cycle) than a configuration with an unpunctured output. Buffer 1200 is designed to operate such that a valid interleaved address is shifted out of the buffer every clock cycle in order to provide a continuous output from the encoder.

In one embodiment, buffer 1200 has two inputs, e.g., signals 1172 and "addr_valid" (FIG. 11), and generates signal 216b (FIG. 2) as its output. As has been described above in reference to FIG. 11, signal 1172 is a stream of addresses where valid and invalid interleaved addresses are interspersed. In the worst-case scenario, the incomplete row in a rectangular matrix has one valid data bit and C−1 dummy bits. Therefore, signal 1172 will have a maximum of C−1 invalid interleaved addresses. If the whole sequence of valid interleaved addresses needs to be output in K clock cycles, ignoring (i.e., dropping) the invalid interleaved addresses may cause a deficit of up to C−1 clock cycles. This deficit is compensated for by generating the first C−1 valid interleaved addresses and queuing them at the end of buffer 1200 prior to starting the output from that buffer. As a result, the whole sequence of K valid interleaved addresses can be continuously output from buffer 1200 in K clock cycles, while dropping up to C−1 invalid addresses.

In one configuration, during the output, valid interleaved addresses are shifted out of buffer 1200 while the buffer continues to receive remaining (valid and invalid) interleaved addresses, one per clock cycle. Based on signal "addr_valid," buffer 1200 sorts the received addresses such that (i) each valid interleaved address is added to the output queue at the end of the queue of valid addresses already stored in the buffer and (ii) each invalid interleaved address is stored at the beginning of the buffer. Consequently, each instance of receiving a valid interleaved address keeps the length of the output queue unchanged (one valid address in, one valid address out), whereas each instance of receiving an invalid interleaved address shortens the output queue by one valid interleaved address (no valid address in, one valid address out). Since no more than C−1 invalid interleaved addresses are applied to buffer 1200 during the output, the whole sequence of valid interleaved addresses can be shifted out of the buffer in a continuous manner in K clock cycles.

In one embodiment, buffer 1200 comprises a chain of N shift registers 1202-1 to 1202-N interposed with N selectors 1204-1 to 1204-N as shown in FIG. 12. Each selector 1204-n (1 n N) has two inputs. For selector 1204-1, one input receives signal 1172 (FIG. 11) and another input receives, e.g., a zero. For each selector 1204-n (2 n N), one input receives signal 1172 and another input is coupled to the output of the preceding register 1202-(n−1).

Selectors 1204 are controlled by a selector control circuit 1206, which receives signal "addr_valid" from comparator 1170 (FIG. 1) and generates control signals 1208-1 to 1208-N. Based on signal 1208-n, either the first or second input of each selector 1204-n is selected to be coupled to its output. For example, if the corresponding signal 1208-n (1 n N) is high (logical one), then signal 1172 is selected; and, if the corresponding signal 1208-n is low (logical zero), then the output of register 1202-(n−1) is selected for each selector 1204-n (2 n N) and zero is selected for selector 1204-1 (n=1). In one configuration, at any time, signals 1208-n (1 n N) are such that only one signal 1208-*n'* is high, while all other signals 1208-*n* (n n') are low. In one embodiment, N=257, corresponding to the largest possible value of C−1.

In one configuration, buffer 1200 operates as follows. Before any valid interleaved addresses are shifted out from register 1202-N, C−1 valid interleaved addresses are generated by circuit 712 (FIG. 11) and queued at the end of buffer 1200 in registers 1202-(N−C+1) through 1202-N, with the first interleaved address stored in register 1202-N, the second interleaved address stored in register 1202-(N−1), etc.

Then, a continuous stream of valid interleaved addresses can be output from buffer 1200 as follows. If a next interleaved address generated by circuit 712 and applied to buffer 1200 (signal 1172) is a valid interleaved address, then it is added to the end of the output queue, i.e., written into register 1202-*m*, where m is the smallest n for registers 1202-*n* having the previously received valid interleaved addresses. At the same time, the valid interleaved address stored at the beginning of the output queue, i.e., in register 1202-N, is output from buffer 1200, and each valid interleaved address stored in registers 1202-*m* through 1202-(N−1) is shifted to the next register 1202 (i.e., to the right in FIG. 12). After the shift, registers 1202-*m* through 1202-N store the current queue of valid interleaved addresses.

If, on the other hand, a next interleaved address generated by circuit 712 and applied to buffer 1200 (signal 1172) is an invalid interleaved address, then it is written into register 1202-1. At the same time, each value (which could be an invalid interleaved address, a zero, or a valid interleaved address) stored in registers 1202-1 through 1202-(N−1), is shifted to the next register 1202 (i.e., to the right in FIG. 12) and the valid interleaved address stored in register 1202-N is output from buffer 1200. After the shift, register 1202-1 has an invalid interleaved address; each register 1202-2 through 1202-*m* has an invalid interleaved address or a zero; and registers 1202-(*m*+1) through 1202-N store the current queue of valid interleaved addresses. In addition, circuit 1206 updates the current smallest value of n corresponding to the registers 1202-*n* currently storing valid interleaved addresses to be m'=m+1.

The described processing is repeated for each next interleaved address (valid or invalid) applied to buffer 1200. Since the maximum number of invalid interleaved addresses does not exceed C−1, a continuous stream of valid interleaved addresses is output from buffer 1200, one address per clock cycle.

In one embodiment, encoder 200 is configured to begin outputting encoded data before a data block has completely shifted into the encoder. More specifically, encoder 200 is configured to begin outputting the encoded data when (i) circuits 702, 704, and 706 of IAG 204 have sufficiently completed calculations to enable circuit 712 to generate interleaved addresses and (ii) the corresponding data block is still being received by encoder 200. For example, with an illustrative block size of 40 bits, circuits 702, 704, and 706 can complete their calculations in 12 clock cycles. Consequently, encoder 200 can begin to output the encoded data at the 13th clock cycle. If, during such operations, the input bit corresponding to the current interleaved output bit has not yet been shifted into the memory, then the outputting of data is temporarily suspended until that input bit arrives, at which time the outputting of data may be continued. In this case, the output of interleaved data will not be continuous, which may be inappropriate for certain applications. For such applications, it may be desirable to wait until all—or at least enough—of the input data has arrived before initiating the output of interleaved data to ensure a continuous flow of output data.

While this invention has been described with reference to illustrative embodiments, this description is not intended to be construed in a limiting sense. For example, an encoder of the present invention may be implemented in an integrated circuit, such as an application-specific integrated circuit (ASIC) or a programmable logic device (PLD), and configured to operate at different clock speeds. Puncturing may be applied to the output. Interleaved addresses may be either stored or generated on the fly. The encoder may be configured to simultaneously receive and output data, which data may correspond to the same or different data blocks. The output may be variously timed, e.g., delayed with respect to the corresponding incoming data block. Various modifications of the described embodiments, as well as other embodiments of the invention, which are apparent to persons skilled in the art to which the invention pertains are deemed to lie within the principle and scope of the invention as expressed in the following claims.

While the exemplary embodiments of the present invention have been described with respect to processes of circuits, including possible implementation as a single integrated circuit, the present invention is not so limited. As would be apparent to one skilled in the art, various functions of circuit elements may also be implemented as part of a software program. Such software may be employed in, for example, a digital signal processor, micro-controller or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of program code (often referred to in the art as an "IP core") that is programmed into a PLD, such as HDL or VHDL source code or a suitable object code.

Although the acts in the following method claims, if any, are recited in a particular sequence with corresponding labeling, unless the claim recitations otherwise imply a particular sequence for implementing some or all of those acts, those acts are not necessarily intended to be limited to being implemented in that particular sequence.

What is claimed is:

1. A method for interleaving an incoming data sequence to generate an interleaved data sequence, comprising:
storing the incoming data sequence in a memory device;
generating a kernel array based on the size of the incoming-data sequence;

recursively generating, using the kernel array, a sequence of two or more pointer arrays, each pointer array having elements corresponding to locations in the incoming data sequence; and generating the interleaved data sequence based on the elements in the sequence of pointer arrays, wherein the mapping from the incoming data sequence to the interleaved data sequence conforms to a 3G Partnership Project (3GPP) specification.

2. The invention of claim 1, wherein generating the interleaved data sequence comprises:

generating a sequence of addresses for the interleaved data sequence; and reading data from the memory device based on the sequence of addresses to generate the interleaved data sequence.

3. The invention of claim 2, wherein the reading of the data from the memory device is initiated prior to storing the entire incoming data sequence into the memory device.

4. The invention of claim 2, wherein the initial address in the sequence is available before the entire incoming data sequence has been received by the memory device.

5. The invention of claim 1, wherein the kernel array is a source q array and generating the kernel array comprises:

initializing the source q array using $q'_0=1$; and recursively calculating $q'_i$ using the following equation:

$$q'_i = (q_i - q_{i-1} q'_{i-1}) \bmod (p-1), \text{ for } i=1, 2, \ldots, R-1$$

where $q'_i$ is the source q array, $q_i$ is a set of minimum prime integers, p is a prime number, and R is a number of rows and i is a row index of a rectangular matrix corresponding to the incoming data sequence, said matrix specified by said 3GPP specification.

6. The invention of claim 5, wherein:

recursively generating the sequence of pointer arrays comprises:

initializing the sequence of pointer arrays $C_i^j$ using $C_i^0 = 0$, where j is a column index of the rectangular matrix; and calculating a pointer array corresponding to column (j+1) using the following equation:

$$C_i^{j+1} = (C_i^j + q'_i) \bmod (p-1), \text{ for } i=0, 1, 2, \ldots, R-1 \text{ and } j=0, 1, 2, \ldots, C-1; \text{ and}$$

generating the interleaved data sequence comprises generating a sequence of addresses $k_j(i)$ for the interleaved data sequence using the following equation:

$$k_j(i) = CT(i) + s(C_i^j)$$

where C is a number of columns in the rectangular matrix, T(i) is an inter-row permutation pattern corresponding to row i, said permutation pattern specified by said 3GPP specification, and $k_j(i)\%K$, where K is the length of the incoming data sequence.

7. A machine-readable medium on which is stored instructions for programming a programmable logic device to execute therein the method of claim 1.

8. An apparatus for interleaving an incoming data sequence to generate an interleaved data sequence, comprising:

a memory configured to receive an incoming data sequence; and an address generator configured to:

generate a kernel array based on the size of the incoming data sequence;

recursively generate, using the kernel array, a sequence of pointer arrays, each pointer array having elements corresponding to locations in the incoming data sequence;

address the memory to generate the interleaved data sequence based on the elements in the sequence of pointer arrays; and generate a sequence of addresses for the interleaved data sequence, wherein:

data are read from the memory using the sequence of addresses to generate the interleaved data sequence; and the address generator is further configured to:

initiate the reading of the data from the memory prior to when the memory has received the entire incoming data sequence;

start generation of the sequence of addresses before the incoming data sequence is fully received by the memory;

suspend the generation, when a data bit corresponding to a last generated address is not yet received; and continue the generation, when the data bit corresponding to the last generated address is received.

9. The invention of claim 8, wherein the initial address in the sequence of addresses is available before the entire incoming data sequence has been received by the memory.

10. The invention of claim 8, wherein the kernel array is a source q array and the address generator is configured to:

initialize the source q array using $q'_0=1$; and recursively calculate $q'_i$ using the following equation:

$$q'_i = (q_i - q_{i-1} + q'_{i-1}) \bmod (p-1), \text{ for } i=1, 2, \ldots, R-1$$

where $q'_i$ is the source q array, $q_i$ is a set of minimum prime integers, p is a prime number, and R is a number of rows and i is a row index of a rectangular matrix corresponding to the incoming data sequence.

11. The invention of claim 10, wherein the address generator is configured to:

initialize the sequence of pointer arrays $C_i^j$ using $C_i^0 = 0$, where j is a column index of the rectangular matrix; and calculate a pointer array corresponding to column (j+1) using the following equation:

$$C_i^{j+1} = (C_i^j + q'_i) \bmod (p-1), \text{ for } i=0, 1, 2, \ldots, R-1 \text{ and } j=0, 1, 2, \ldots, C-1;$$

and generate the interleaved data sequence comprises generating a sequence of addresses $k_j(i)$ for the interleaved data sequence using the following equation:

$$k_j(i) = CT(i) + s(C_i^j)$$

where C is a number of columns in the rectangular matrix, T(i) is an inter-row permutation pattern corresponding to row i, and $k_j(i)\%K$, where K is the length of the incoming data sequence.

12. The invention of claim 8, wherein the apparatus is part of a turbo-encoder.

13. A method of interleaving an incoming data sequence to generate an interleaved data sequence, comprising:

(A) receiving the incoming data sequence at a memory; and (B) enabling an address generator to generate a sequence of addresses corresponding to the interleaved data sequence, wherein the address generator is adapted to generate the first address in the sequence before the entire incoming data sequence is received by the memory, wherein:
the address generator generates the first address in the sequence of addresses before the entire incoming data sequence is received at the memory; and
enabling the address generator to generate the sequence of addresses comprises:
starting generation of the sequence of addresses before the incoming data sequence is fully received by the memory;
suspending the generation, when a data bit corresponding to a last generated address is not yet received; and
continuing the generation, when the data bit corresponding to the last generated address is received.

14. The invention of claim 13, wherein enabling the address generator to generate the sequence of addresses comprises generating the sequence of addresses without storing the entire sequence of addresses in memory at one time.

15. An apparatus for interleaving an incoming data sequence to generate an interleaved data sequence, comprising:
a memory device configured to receive the incoming data sequence; and
an address generator configured to generate a sequence of addresses corresponding to the interleaved data sequence and address the memory device to output the interleaved data sequence, wherein the address generator is further configured to:
generate a kernel array based on the size of the incoming data sequence;
recursively generate using the kernel array, a sequence of two or more pointer arrays, each pointer array having elements corresponding to locations in the incoming data sequence; and
address the memory device to generate the interleaved data sequence based on the elements in the sequence of pointer arrays, wherein the mapping from the incoming data sequence to the interleaved data sequence conforms to a 3G Partnership Project (3GPP) specification.

16. The invention of claim 15, wherein the address generator is configured to generate the first address in the sequence before the entire incoming data sequence has been received by the memory device.

17. The invention of claim 15, wherein the address generator is configured to:
start generation of the sequence of addresses before the incoming data sequence is fully received by the memory device;
suspend the generation, when a data bit corresponding to a last generated address is not yet received; and
continue the generation, when the data bit corresponding to the last generated address is received.

18. The invention of claim 15, wherein the memory device is designed to concurrently receive and output data.

19. The invention of claim 18, wherein:
the memory device comprises two random access memories (RAMs); and
the memory device is configured to receive a current incoming data sequence at one RAM while outputting an interleaved data sequence for a previous incoming data sequence from the other RAM.

20. The invention of claim 19, wherein each RAM has two output ports, wherein, for each RAM, the memory device is configured to concurrently output the corresponding original incoming data sequence and the corresponding interleaved data sequence at the two output ports.

21. The invention of claim 15, wherein the address generator is configured to generate the sequence of addresses without storing the entire sequence of addresses in memory at one time.

22. The invention of claim 15, wherein the address generator comprises a buffer configured to store a queue of addresses having part of the sequence of addresses.

23. The invention of claim 22, wherein the buffer is configured to add a generated address to the queue, when the generated address is a valid interleaved address.

24. The invention of claim 15, wherein the address generator comprises:
a first circuit configured to receive an input signal corresponding to the length of the incoming data sequence and generate one or more outputs based on the input signal;
a second circuit coupled to at least one output of the first circuit and configured to generate and transfer a base sequence to memory;
a third circuit coupled to at least one output of the first circuit and configured to generate and transfer a kernel array to memory; and
a fourth circuit coupled to at least one output of the first circuit and configured to:
access the base sequence and the kernel array from memory; and
generate the sequence of addresses based on at least one output of the first circuit, the base sequence, and the kernel array.

25. The invention of claim 24, wherein:
the one or more outputs of the first circuit comprise:
a first signal corresponding to a number of rows of a rectangular matrix corresponding to the incoming data sequence;
a second signal corresponding to a number of columns of the rectangular matrix;
a third signal corresponding to a prime number corresponding to the length of the incoming data sequence;
a fourth signal corresponding to a primitive root corresponding to the prime number; and
a fifth signal corresponding to a pattern number corresponding to the length of the incoming data sequence;
the third and fourth signals are applied to the second circuit;
the first and third signals are applied to the third circuit; and
the first, second, third, and fifth signals are applied to the fourth circuit.

26. The invention of claim 25, wherein the fourth circuit includes a logic circuit configured to remove a generated address from the sequence of addresses, when the generated address corresponds to a dummy bit of the rectangular matrix.

27. The invention of claim 15, wherein the apparatus is part of a turbo-encoder.

28. A machine-readable medium on which is stored instructions for programming a programmable logic device to create therein the apparatus of claim 15.

29. The invention of claim 15, wherein the kernel array is a source q array and the address generator is configured to:

initialize the source q array using $q'_0=1$; and
recursively calculate $q'_i$ using the following equation:

$$q'_i=(q_i-q_{i-1}+q'_{i-1}) \bmod(p-1), \text{ for } i=1, 2, \ldots, R-1$$

where $q'_i$ is the source q array, $q_i$ is a set of minimum prime integers, p is a prime number, and R is a number of rows and i is a row index of a rectangular matrix corresponding to the incoming data sequence, said matrix specified by said 3GPP specification.

30. The invention of claim 29, wherein the address generator is configured to:
  initialize the sequence of pointer arrays $C_i^j$ using $C_i^0=0$, where j is a column index of the rectangular matrix; and
  calculate a pointer array corresponding to column (j+1) using the following equation:

$$C_i^{j+1}=(C_i^j+q'_i) \bmod(p-1), \text{ for } i=0, 1, 2, \ldots, R-1 \text{ and } j=0, 1, 2, \ldots, C-1;$$

and
  generate the interleaved data sequence comprises generating a sequence of addresses $k_j(i)$ for the interleaved data sequence using the following equation:

$$k_j(i)=CT(i)+s(C_i^j)$$

where C is a number of columns in the rectangular matrix, T(i) is an inter-row permutation pattern corresponding to row i, said permutation pattern specified by said 3GPP specification, and $k_j(i) \% K$, where K is the length of the incoming data sequence.

31. An apparatus for interleaving an incoming data sequence to generate an interleaved data sequence, comprising:
  a memory configured to receive the incoming data sequence; and
  an address generator configured to generate a sequence of addresses corresponding to the interleaved data sequence and address the memory to output the interleaved data sequence, wherein the address generator is adapted to generate the first address in the sequence before the entire incoming data sequence is received by the memory, wherein the address generator is configured to:
    start generation of the sequence of addresses before the incoming data sequence is fully received by the memory;
    suspend the generation, when a data bit corresponding to a last generated address is not yet received; and
    continue the generation, when the data bit corresponding to the last generated address is received.

32. An apparatus for interleaving an incoming data sequence to generate an interleaved data sequence, comprising:
  a memory configured to receive the incoming data sequence; and
  an address generator configured to generate a sequence of addresses corresponding to the interleaved data sequence and address the memory to output the interleaved data sequence, wherein the address generator is adapted to generate the first address in the sequence before the entire incoming data sequence is received by the memory, wherein:
    the memory is designed to concurrently receive and output data;
    the memory comprises two random access memories (RAMs); and
    the memory is configured to receive a current incoming data sequence at one RAM while outputting an interleaved data sequence for a previous incoming data sequence from the other RAM.

33. The invention of claim 32, wherein each RAM has two output ports, wherein, for each RAM, the memory is configured to concurrently output the corresponding original incoming data sequence and the corresponding interleaved data sequence at the two output ports.

* * * * *